(12) United States Patent
Lin

(10) Patent No.: US 7,952,198 B2
(45) Date of Patent: May 31, 2011

(54) BGA PACKAGE WITH LEADS ON CHIP

(75) Inventor: Hung-Tsun Lin, Tainan (TW)

(73) Assignees: ChipMos Technologies (Bermuda) Ltd., Hamilton (BM); ChipMos Technologies Inc., Hsinchu (TW)

( * ) Notice: Subject to any disclaimer, the term of this patent is extended or adjusted under 35 U.S.C. 154(b) by 0 days.

(21) Appl. No.: 12/153,176

(22) Filed: May 14, 2008

(65) Prior Publication Data

US 2010/0200972 A1 Aug. 12, 2010

Related U.S. Application Data

(63) Continuation-in-part of application No. 11/543,053, filed on Oct. 5, 2006, now abandoned.

(51) Int. Cl.
*H01L 23/48* (2006.01)
*H01L 23/52* (2006.01)
*H01L 23/40* (2006.01)

(52) U.S. Cl. ........ 257/738; 257/666; 257/667; 257/678; 257/778; 257/787; 257/E23.039; 257/E23.042; 257/E23.066; 257/E23.069; 257/E23.116; 438/106; 438/110; 438/113; 438/119; 438/121

(58) Field of Classification Search .......... 257/666–678, 257/690, 778, 779, 780, 782–784, 787, E23.031–E23.037, 257/E23.023, E34.004, E23.013, E23.02, 257/E23.039, E23.042, E23.04, E23.066, 257/E23.069, E23.116; 438/106, 110–113, 118, 119, 121–127

See application file for complete search history.

(56) References Cited

U.S. PATENT DOCUMENTS

| | | | | | |
|---|---|---|---|---|---|
| 5,677,566 | A | * | 10/1997 | King et al. | 257/666 |
| 7,170,161 | B2 | * | 1/2007 | Yu et al. | 257/692 |
| 7,195,957 | B2 | * | 3/2007 | Koon et al. | 438/124 |
| 2002/0125568 | A1 | * | 9/2002 | Jiang et al. | 257/737 |
| 2002/0171130 | A1 | * | 11/2002 | Takahashi et al. | 257/673 |
| 2002/0195708 | A1 | * | 12/2002 | Stephenson et al. | 257/738 |
| 2004/0080031 | A1 | * | 4/2004 | Huang et al. | 257/678 |
| 2005/0046000 | A1 | * | 3/2005 | Seng et al. | 257/676 |
| 2005/0189627 | A1 | * | 9/2005 | Ito et al. | 257/666 |
| 2007/0080466 | A1 | * | 4/2007 | Chou et al. | 257/777 |

\* cited by examiner

*Primary Examiner* — Lynne A Gurley
*Assistant Examiner* — Meiya Li

(57) ABSTRACT

A BGA package primarily includes a leadless leadframe with a plurality of leads, a chip disposed on the leads, a die-attaching layer adhering to an active surface of the chip and the top surfaces of the leads, a plurality of bonding wires electrically connecting the chip to the leads, an encapsulant, and a plurality of solder balls. Each lead has a bottom surface including a wire-bonding area and a ball-placement area, moreover, a plurality of lips project from the bottom surfaces of the leads around the ball-placement areas. The encapsulant encapsulates the chip, the bonding wires, the die-attaching layer, and the top surfaces, the bottom surfaces except the ball-placement areas. The solder balls are disposed on the ball-placement areas.

20 Claims, 9 Drawing Sheets

BGA PACKAGE WITH LEADS ON CHIP

CROSS REFERENCE TO RELATED APPLICATIONS

This is a continuation-in-part of U.S. patent application Ser. No. 11/543,053, filed Oct. 5, 2006 now abandoned.

FIELD OF THE INVENTION

The present invention relates to semiconductor devices, and more particularly, to a Ball Grid Array (BGA) package with lead-on-chip (LOC) configuration.

BACKGROUND OF THE INVENTION

The conventional Ball Grid Array packages (BGA) are always using printed circuit boards as chip carriers. In one kind of BGA packages, the active surfaces of chips face to the printed circuit boards, and the bonding wires pass through the slots of the printed circuit boards. This kind of BGA package is often called Window BGA, Chip-On-Board BGA, or Chip-On-Substrate BGA.

As shown in FIG. 1, a conventional BGA package 100 includes a printed circuit board 110, a chip 120, a die-attaching layer 130, a plurality of bonding wires 140, an encapsulant 150, and a plurality of solder balls 160. The printed circuit board 110 is made of BT which has a top surface 111, a bottom surface 112, a slot 113 penetrating the top surface 111 and the bottom surface 112, a plurality of bonding fingers, and a plurality of ball pads, not shown in the figure. A plurality of bonding pads 40 are formed on the active surface 121 of the chip 120. The active surface 121 of the chip 120 is attached to the top surface 111 of the printed circuit board 110 by the die-attaching layer 130 so that the bonding pads 122 are aligned in the slot 113. The bonding pads 122 of the chip 120 are electrically connected to the printed circuit board 110 by the bonding wires 140 through the slot 113. The encapsulant 150 is formed on the top surface 111 of the printed circuit board 110 as well as in the slot 113 to encapsulate the chip 120 and the bonding wires 140. The solder balls 160 are disposed on the bottom surface 112 of the printed circuit board 110 as external terminals. Since the active surface 121 of the chip 120 is close to the printed circuit board 110, the lengths of the bonding wires 140 can be shortened so that it can be implemented in the packages of high-frequency memories such as DDR II or other ASIC.

However, the cost of the printed circuit board is much higher than the one of a leadframe and the reliability against moisture is also poor. If a leadframe can be used as a chip carrier to assembly as a BGA package, the cost can be greatly reduced. Leadframe-based BGA packages using leadframes as chip carriers have been proposed in the field. After leadframe etching, a chip is disposed on top surfaces of the leads of the leadframe and is electrically connected to the leadframe by bonding wires. Then, encapsulant encapsulates the chip and the bonding wires with the bottom surfaces of the leads of the leadframe exposed, i.e., the surfaces without disposing the chip. Then, solder balls are placed on the exposed surfaces of the leads followed by singulation of the leadframe and the encapsulant to manufacture a plurality of leadframe-based BGA packages. However, the solder balls totally exposed outside the package without any protections leading to the dropping of the solder balls during shipping, handling, and storage. Moreover, the bonding interfaces between the solder balls and leads are planar leading to cracks during SMT processes and under operations, the stability of solder ball placement and the reliability of the packages require further improvement.

Furthermore, conventional leadframe-based BGA packages are also taught by Lin in U.S. Pat. No. 5,830,800 and King et al. in U.S. Pat. No. 5,677,566. In spite of the solder balls are partially embedded in the cavities of the encapsulant but still are bonded to flat ball-placement surfaces of the leadframe, therefore, the joint strengths of the solder balls are still weak leading to dropped balls due to the stresses caused by the encapsulant or dielectrics.

SUMMARY OF THE INVENTION

The main purpose of the present invention is to provide a BGA package with lead-on-chip (LOC) configuration to provide non-planar ball-placement surfaces on leadless leadframe to increase the ball-joint areas of the solder balls and to eliminate the voids at the peripheries of the ball-joint surfaces so that the joint strengths of the solder balls can be enhanced to resolve the dropped balls issues of the conventional leadless leadframe with planar ball-placement surfaces.

The second purpose of the present invention is to provide a BGA package with lead-on-chip (LOC) configuration to assemble a chip with center bonding pads or/and peripheral bonding pads on a leadless leadframe.

The third purpose of the present invention is to provide a BGA package with lead-on-chip (LOC) configuration to enhance the stress resistance of the solder balls on a leadless leadframe.

The fourth purpose of the present invention is to provide a BGA package with lead-on-chip (LOC) configuration to minimize the package dimension to become a Chip Scale Package (CSP).

The fifth purpose of the present invention is to provide a BGA package with lead-on-chip (LOC) configuration to avoid stresses directly exerting on the solder balls.

The sixth purpose of the present invention is to provide a BGA package with lead-on-chip (LOC) configuration to achieve roughness variations of leads to enhance the joint strengths of the encapsulant and the solder balls without affecting the planar surfaces of the leads for die attachment by adjusting the etching conditions twice while etching the bottom surfaces of the leads.

The seventh purpose of the present invention is to provide a BGA package with lead-on-chip (LOC) configuration to enhance joint strengths of the solder balls and to prevent oxidation of the exposed surfaces of the leads.

The eighth purpose of the present invention is to provide a BGA package with lead-on-chip (LOC) configuration to provide an encapsulant to encapsulate all the surfaces with the non-planar ball-placement areas in cavities exposed from the encapsulant.

According to the invention, a BGA package primarily comprises a leadless leadframe, a chip, a die-attaching layer, a plurality of bonding wires, an encapsulant, and a plurality of solder balls. The leadless leadframe has a plurality of leads each having a top surface and a bottom surface wherein the bottom surface includes a wire-bonding area and a ball-placement area. Each lead further has a lip projecting from the bottom surface around the corresponding ball-placement area. The chip is disposed on the top surfaces of the leads and has an active surface and a plurality of first bonding pads on the active surface. The die-attaching layer adheres to the active surface of the chip and the top surfaces of the leads. The first bonding pads of the chip are electrically connected to the corresponding wire-bonding areas of the leads by the bonding wires. The encapsulant encapsulates the chip, the bonding wires, the die-attaching layer, and the top surfaces, and the laterals of the leads. The ball-placement areas are embedded in the encapsulant. Moreover, a plurality of cavities are formed in the bottom of the encapsulant and aligned with the ball-placement areas so that the encapsulant further encapsulates the bottom surfaces of the leads except the ball-placement areas. Additionally, the lips have a plurality of internal sides formed inside the cavities. The solder balls are disposed on the ball-placement areas and the internal sides of the lips to be partially embedded in the corresponding cavities. Accordingly, the joint interfaces between the solder balls and the leads are non-planar and are embedded in the cavities of the encapsulant.

DETAIL DESCRIPTION OF THE INVENTION

Please refer to the attached drawings, the present invention will be described by means of embodiment(s) below.

Figure 1:
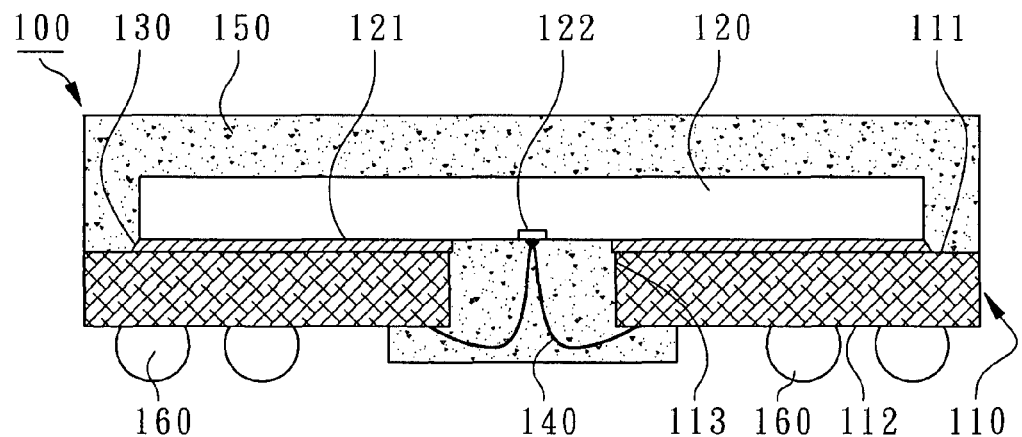
FIG. 1 shows a cross-sectional view of a conventional BGA package.
Figure 2:
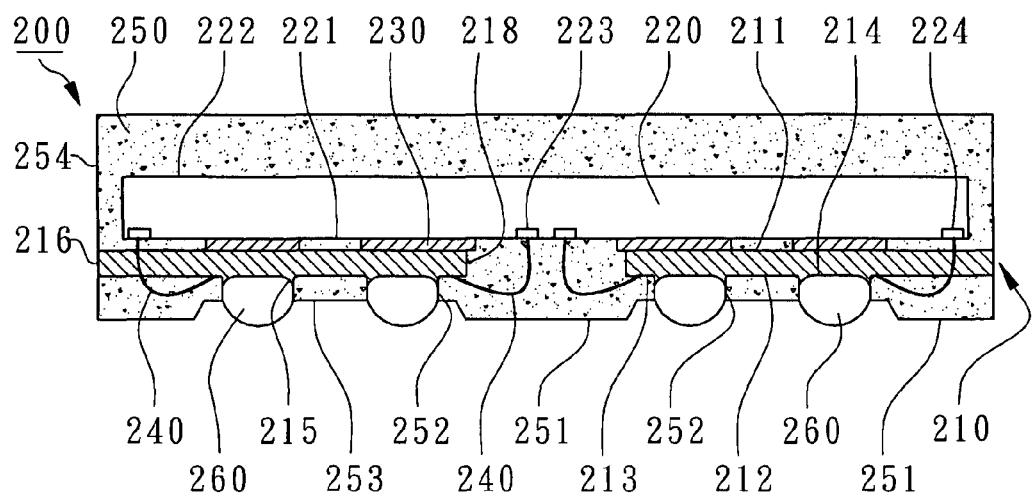
FIG. 2 shows a cross-sectional view of a BGA package with LOC configuration according to the first embodiment of the present invention.

A BGA package with LOC configuration is disclosed according to the first embodiment. As shown in FIG. 2, a BGA package 200 primarily comprises a leadless leadframe having a plurality of leads 210, a chip 220, a die-attaching layer 230, a plurality of bonding wires 240, an encapsulant 250, and a plurality of solder balls 260. Normally, the materials of the leads 210 are metals such as copper, iron, or its alloys and are formed by punching or etching. Each lead 210 has a top surface 211 and a bottom surface 212 where the bottom surface 212 includes a wire-bonding area 213 and a ball-placement area 214. Each lead 210 further has an external end 216 between the top surface 211 and the bottom surface 212 away from the chip 220 and an internal end 218 extending toward a plurality of bonding pads 223 of the chip 220 where the external end 216 is exposed from one side of the encapsulant 250 in this embodiment. The wire-bonding areas 213 are located at the internal ends 218 of the corresponding leads 210 for bonding the bonding wires 240. The ball-placement areas 214 are arranged in an array for placing the solder balls 260. The ball-placement areas 214 are embedded in the encapsulant 250. Moreover, a plurality of cavities 252 are formed in the bottom 251 of the encapsulant 250 and aligned with the ball-placement areas 214.

Figure 4:
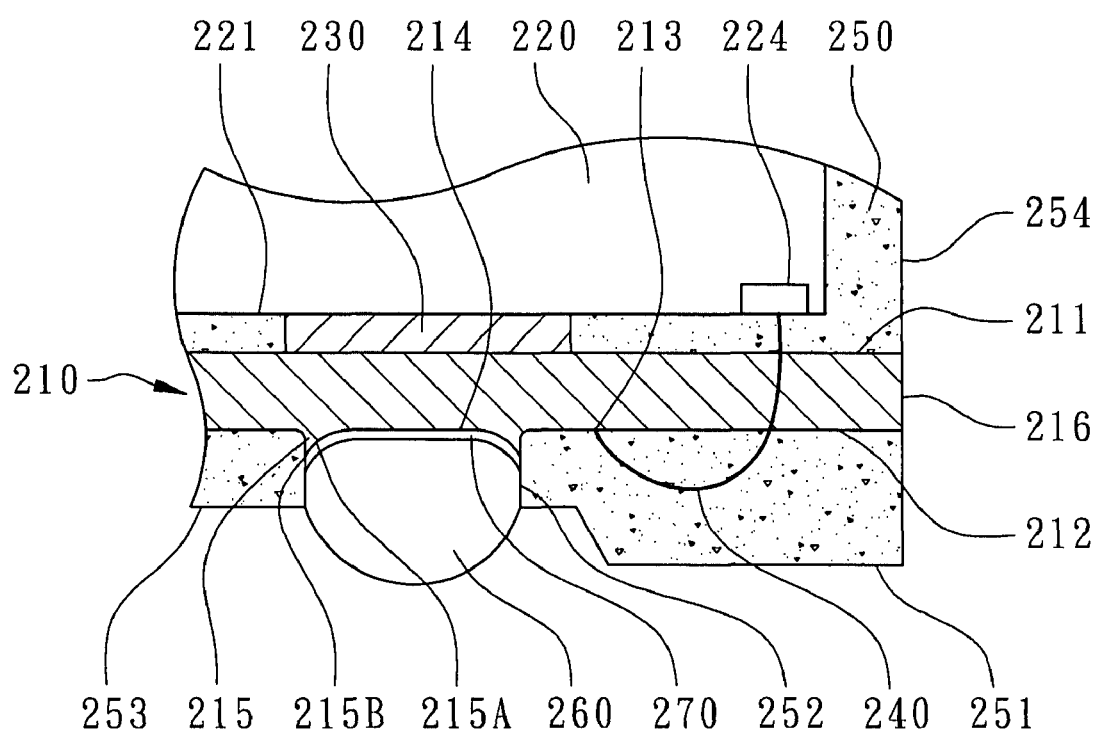
FIG. 4 shows a partial cross-sectional view of the BGA package according to the first embodiment of the present invention.

As shown in FIG. 2 and FIG. 4, a plurality of lips 215 project from the bottom surfaces 212 of the leads 210 to enclose the peripheries of the ball-placement areas 214 where the lips 215 have a plurality of internal sides 215A for changing the jointing shapes of the solder balls 260. Preferably, as shown in FIG. 4, the internal sides 215A of the lips 215 have leading angles so that the internal sides 215A of the lips 215 are connected with the corresponding cavities 252 in a shape of a continuous arc to avoid stresses directly exerting on the solder balls 260. More preferably, the lips 215 have sharp edges 215B located at the interfaces between the encapsulant 250 and the solder balls 260 to stop or/and interfere the stress propagation from the encapsulated bottom surface 212 of the leads 210 to the ball-placement areas 214.

Figure 3:
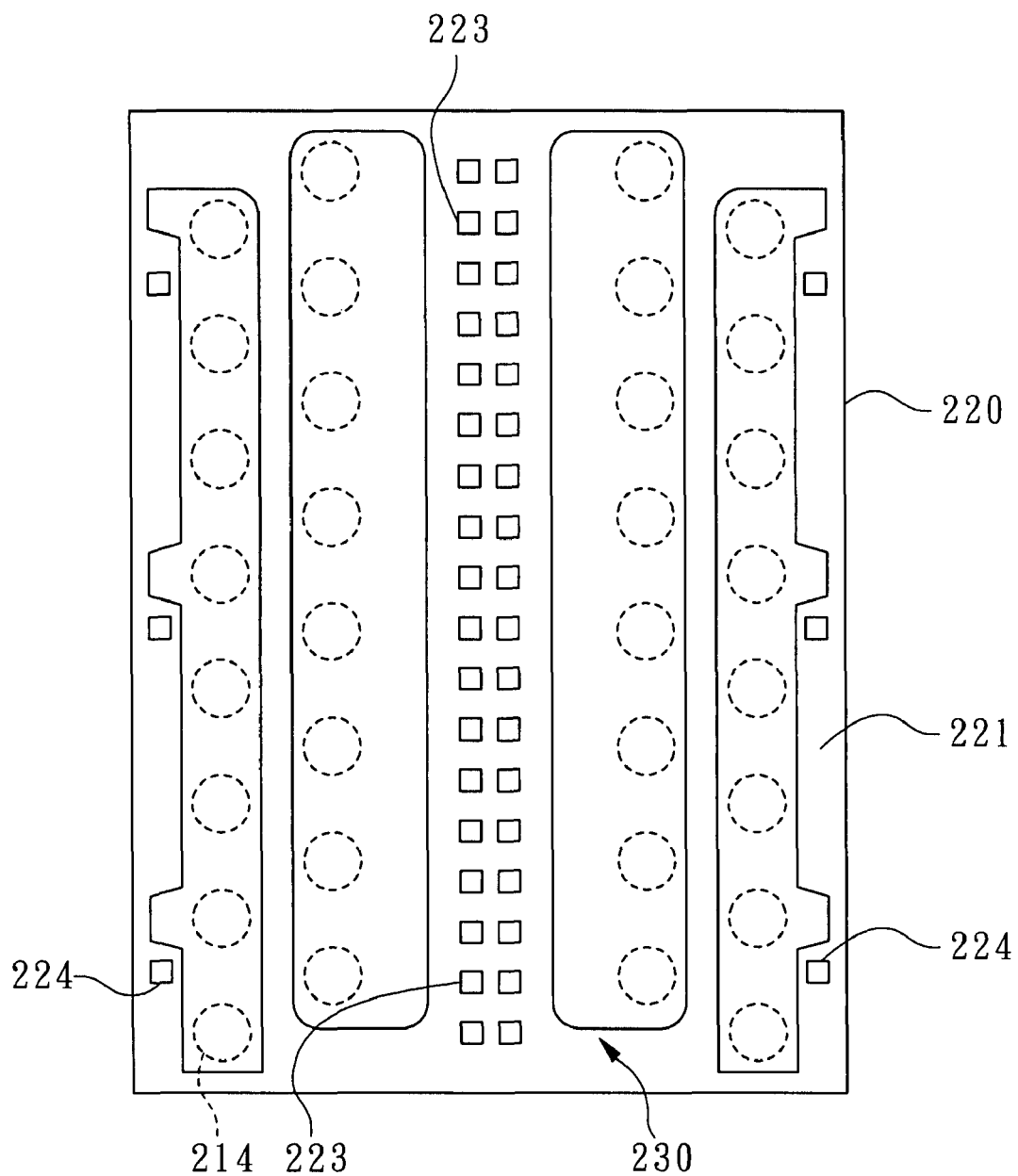
FIG. 3 shows a view of an active surface of a chip with a die-attaching layer of the BGA package according to the first embodiment of the present embodiment.

The chip 220 is disposed on the top surfaces 211 of the leads 210 and has an active surface 221 and a corresponding back surface 222 where a plurality of first bonding pads 223 are formed on the active surface 221. In the present embodiment, as shown in FIG. 3, the first bonding pads 223 are disposed at a central line of the active surface 221, and the chip 220 further has at least one second bonding pad 224 formed at one of the peripheries of the active surface 221. The die-attaching layer 230 is patterned not to cover the second bonding pads 224 (as shown in FIG. 3). Since there are gaps between leads 210 and adjacent leads 210, the leads 210 also don't cover the second bonding pad 224. Therefore, the bonding wire 240 connecting to the second bonding pad 224 can pass through the lead gap and connect to the corresponding lead 210. There is no need for wire-bonding windows or slots of conventional wiring substrates.

The die-attaching layer 230 adheres to the active surface 221 of the chip 220 and the top surfaces 221 of the leads 210. The adhering area of the die-attaching layer 230 on the top surfaces 211 is at least aligned with the wire-bonding areas 213 and the ball-placement areas 214. The die-attaching layer 230 may be a B-stage printing paste or a die-attaching film which is pre-formed on the active surface 221 of the chip 220 or on the top surfaces 221 of the leads 210. In the present embodiment, the die-attaching layer 230 is pre-printed on the active surface 221 of the chip 220. Preferably, as shown in FIG. 3, the die-attaching layer 230 is patterned to overlap the wire-bonding areas 213 and the ball-placement areas 214 of the leads 210 without covering the first bonding pads 223 and the second bonding pads 224. Therefore, the die-attaching layer 230 can enhance the bonding support of the bonding wires 240 and the placement of the solder balls 260. Moreover, the disposition of the die-attaching layer 230 can further enhance the complete encapsulation of the leads by the encapsulant 250. More preferably, the die-attaching layer 230 is a low modulus elastomer which can elastically support the bonding wires 240 and the solder balls 260 to increase the stress resistance of the solder balls 260.

The first bonding pads 223 of the chip 220 are electrically connected to the corresponding wire-bonding areas 213 of the leads 210 by the bonding wires 240. The encapsulant 250 encapsulates the chip 220, the bonding wires 240, the die-attaching layer 230, the top surfaces 211, and the laterals of the leads 210 between the top surfaces 211 and the bottom surfaces 212. The encapsulant 250 further encapsulates the bottom surfaces 212 except the ball-placement areas 214 because the ball-placement areas 214 are embedded and exposed in the cavities 252. The bottom 251 of the encapsulant 250 in which the cavities 252 are formed is the SMT surface of the BGA package 200, moreover, the internal sides 215A of the lips 215 are exposed inside the cavities 252, as shown in FIG. 4, to protect the joints of the solder balls 260 and to prevent dropping of the solder balls 260. In the present embodiment, after encapsulation, a plurality of cavities 252 are formed in the bottom 251 of the encapsulant 250 by half-etching the leadframe so that the ball-placement areas 214 can be exposed in the cavities 252 from the bottom 251 of the encapsulant 250. In the present embodiment, the encapsulant 250 has at least a recession 253 which is lower than the bottom 251 of the encapsulant 250 where the cavities 252 are located within the recession 253 to maintain the stand-off heights of the solder balls 260.

Furthermore, the encapsulant 250 can completely encapsulate the chip 220 or partially encapsulate the chip 220 to expose the back surface 222 of the chip, depending on the package types. In the present embodiment, the active surface 221 of the chip 220 is not smaller than 70% of the bottom 251 of the encapsulant 250 so that the BGA package 200 becomes a Chip Scale Package (CSP), moreover, all the solder balls 260 are disposed under the chip 220 and supported by the die-attaching layer 230.

Furthermore, the solder balls 260 can be disposed on the ball-placement areas 214 and on the internal sides 215A of the lips 215 by solder paste printing or solder ball placement so that the solder balls 260 are partially embedded inside the corresponding cavities 252. The layout of the solder balls 260 can be the same as the one of the conventional window BGA package 100.

Therefore, the joint interfaces between the solder balls 260 and the leads 210 are non-planar by the lips 215 and are embedded in the cavities 252 of the encapsulant 250. In this embodiment, the joint interfaces have a cross-section of meniscus. Since the leadless leadframe is used as a chip carrier in the BGA package 200, non-planar ball-placement surfaces consisting of the ball-placement areas 214 and the internal sides 215A of the lips 215 are provided to increase the ball-joint areas of the solder balls 260 and stress resistance and also to reduce voids at the peripheries of the ball-placement areas 214 so that the joint strengths of the solder balls can be enhanced to resolve the dropped balls issues of the conventional leadless leadframe with planar ball-placement surfaces, moreover, the solderability of solder balls and the reliability of wire bonding and the stability of solder ball placement can be enhanced. Moreover, the chip 220 with both central and peripheral bonding pads can be packaged with a leadless leadframe to become a low-cost BGA package 200. Preferably, the roughness of the bottom surfaces 212 of the leads 210 is greater than the one of the top surfaces 211 to increase the joint strengths of the encapsulant 250 and the leads 210. To be more specific, the roughness of the bottom surfaces 212 of the leads 210 can be adjusted by changing the two half-etching conditions on the bottom of a leadframe such as components and concentrations of the etching solutions to achieve roughness variations to enhance the joint strengths of the encapsulant 250 and the leads 210 without affecting the planar top surfaces 211 for die attachment.

In the present embodiment of the present invention, as shown in FIG. 4 again, the BGA package 200 further comprises a plating layer 270 formed on the ball-placement areas 214 and the internal sides 215A of the lips 215 to increase the joint strengths of the solder balls 260 and to prevent oxidation of the exposed surfaces of the leads 210, i.e., the surfaces without encapsulated by the encapsulant 250. The materials of the plating layer 270 can be chosen from nickel-gold, tin, nickel-palladium-gold, tin-lead, silver, or tin-bismuth, etc.

Figure 5:
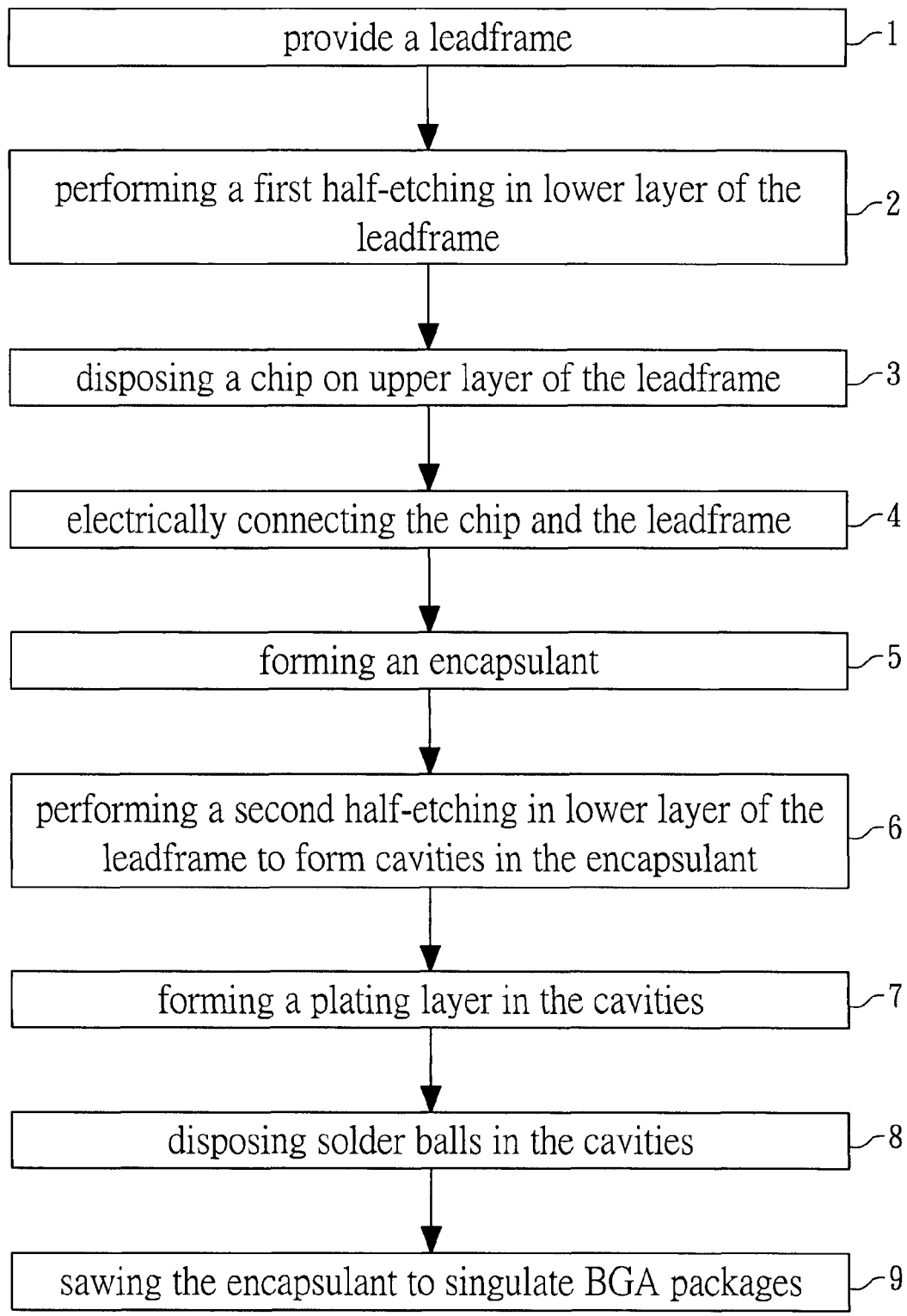
FIG. 5 shows a process flow of manufacturing the BGA package according to the first embodiment of the present invention.

In one embodiment, the manufacturing processes of the BGA package 200 comprising the following steps as shown in FIG. 5, including two half-etching processes. The detail of the manufacturing processes are further described from FIG. 6A to FIG. 6G.

Figure 6A:
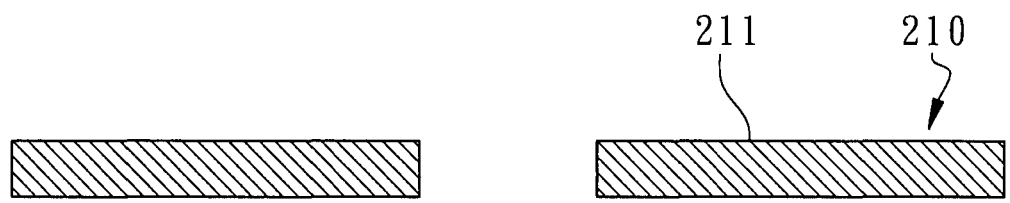
FIG. 6A to FIG. 6G show the cross-sectional views of a leadframe during manufacturing the BGA package according to the first embodiment of the present invention.

Firstly, step 1 of FIG. 5 is illustrated in FIG. 6A. A leadframe is formed by punching or by etching where the leadframe is a leadless leadframe with a plurality of leads 210. The leads 210 are normally made of metal such as copper, iron or its alloy. In step 1, the top surfaces 211 of the leads 210 are formed but the bottom surfaces 212 are not formed by etching yet.

Figure 6B:
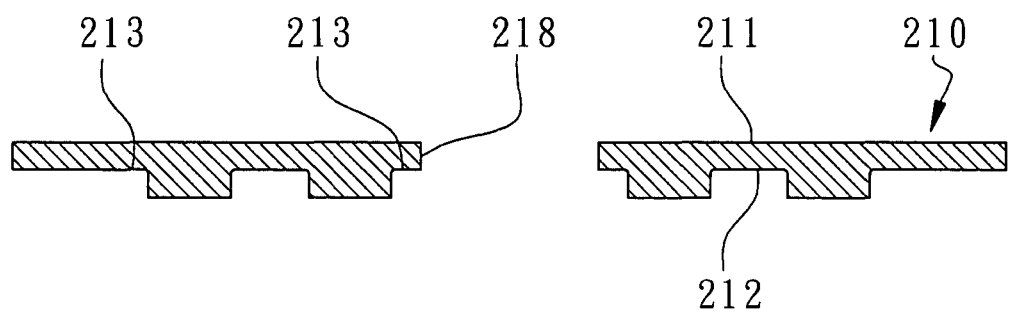

Then, step 2 of FIG. 5 is illustrated in FIG. 6B. A first half-etching step is performed. Most of the bottom surfaces 212 of the leads 210 except the ball-placement areas 214 (as shown in FIG. 2) are formed during the first half-etching processes until a desired thickness of the leads 210 is reached and the wire-bonding areas 213 are formed. To be more specific, the bottom surfaces 212 are defined between an upper layer and a lower layer of the leadframe where the thickness of the lower layer is approximately equal to or smaller than the one of the upper layer. In the first half-etching process, the lower layer of the leadframe are etched away except the ball-placement areas 214, as shown in FIG. 2 and FIG. 6B. Furthermore, when the leadframe is formed by punching, then step 1 and step 2 can be sequentially proceeded. When the leadframe is formed by etching, then step 1 and step 2 can be proceeded at the same time or separated into two independent steps.

Figure 6C:
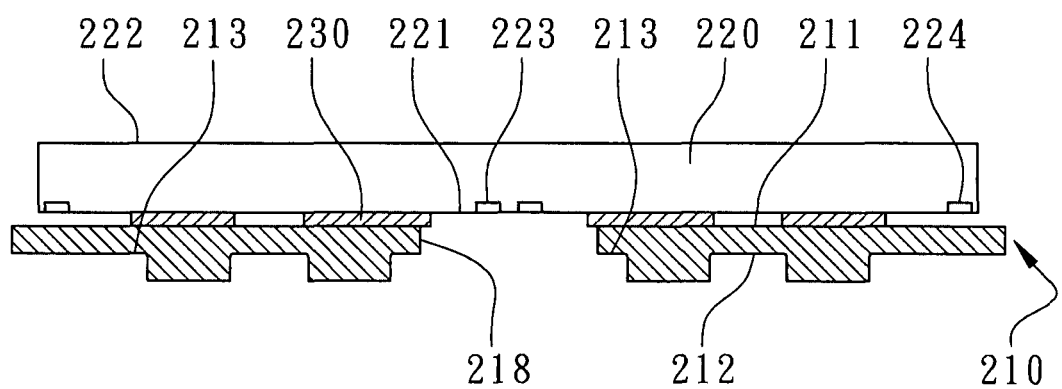

Then, step 3 of FIG. 5 is illustrated in FIG. 6C, a die-attaching layer 230 is formed between the chip 220 and the leads 210 to adhere the active surface 221 of the chip 220 to the top surfaces 211 of the leads 210 so that the chip 220 is disposed on the leads 210, i.e., the upper layer of the leadframe. Since the active surface 221 of the chip 220 faces to the top surfaces 211 of the leads 210, Lead-On-Chip (LOC) configuration is accomplished. The die-attaching layer 230 can be a B-stage printing paste or a die-attaching tape and is pre-formed on the active surface 211 of the cip 220 or on the top surfaces 211 of the leads 210. In the this embodiment, the die-attaching layer 230 is printed on the active surface 221 of the chip 220 and patterned to overlap the wire-bonding areas 213 and the portions of the bottom surface 212 not half-etched yet.

Figure 6D:
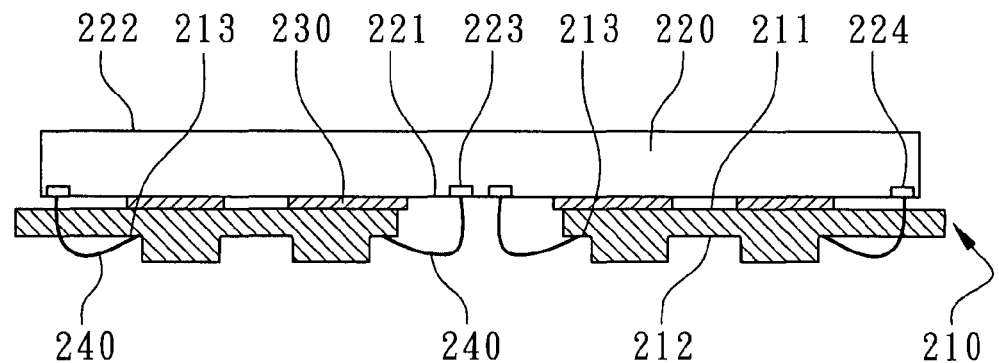

Then, step 4 of FIG. 5 is illustrated in FIG. 6D. A wire-bonding step is performed to form the bonding wires 240. The bonding wires 240 electrically connect the bonding pads 223 and 224 of the chip 220 to the corresponding wire-bonding areas 213 of the leads 210. The bonding wires 240 are thin, long, and flexible metal wires and are formed by ultrasonic bonding (U/S), thermocompression bonding (T/C), or thermosonic bonding (T/S).

Figure 6E:
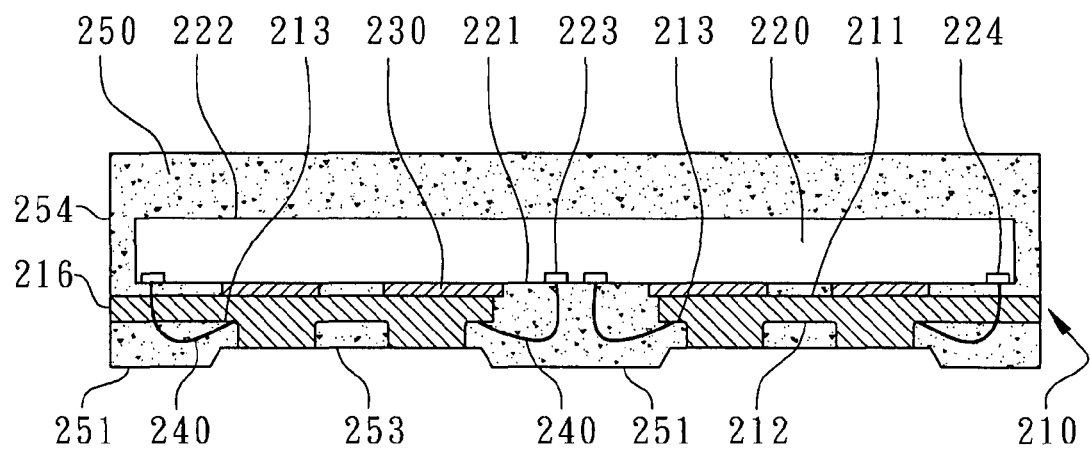

Then, step 5 of FIG. 5 is illustrated in FIG. 6E. A molding step is performed to form an encapsulant 250. The encapsulant 250 encapsulates the chip 220, the bonding wires 240, the die-attaching layer 230, the top surfaces 211 of the leads 210, the bottom surfaces 212 of the leads 210 except not yet half-etched portions of the ball-placement areas 214, as shown in FIG. 2, and the laterals between the top surfaces 211 and the bottom surfaces 212 of the leads 210. The encapsulant 250 is further cured.

Figure 6F:
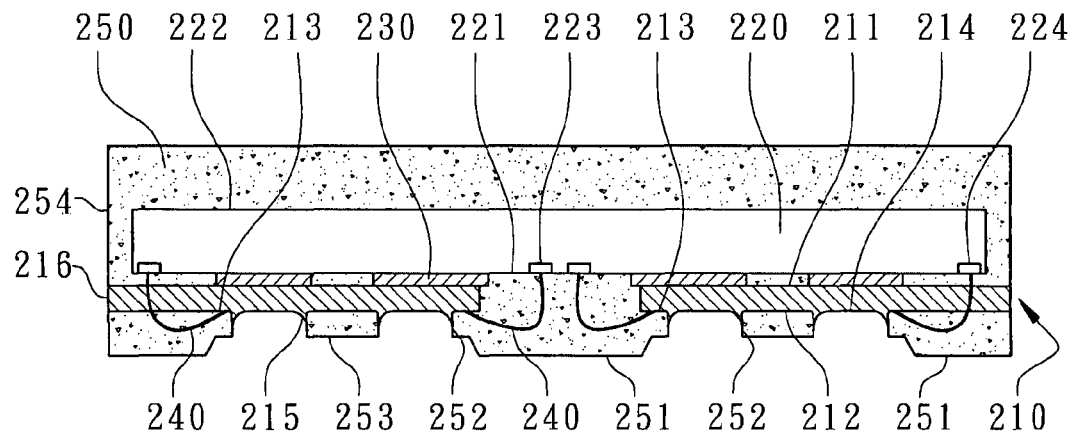

Then, step 6 of FIG. 5 is illustrated in FIG. 6F. A second half-etching step is performed after encapsulation to create a plurality of cavities 252 in the bottom 251 of the encapsulant 250. To be more specific, step 6 is an etching step without masks. The bottom surfaces 212 of the leads 210 exposed in the cavities 252 are the ball-placement areas 214. A plurality of lips 215 are also formed around the ball-placement areas 214 during the second half-etching step. The lips 215 project from the bottom surfaces 212 of the leads 210 at the same time as forming the cavities 252 of the encapsulant 250. In other words, the internal sides of the cavities 252 and the ball-placement areas 214 are embedded in the encapsulant 250 and exposed in the cavities 252. Preferably, the internal sides 215A of the lips 215 are circular arcs, as shown in FIG. 4, to increase the ball-joint areas and to enhance the joint strengths of the solder balls.

Figure 6G:
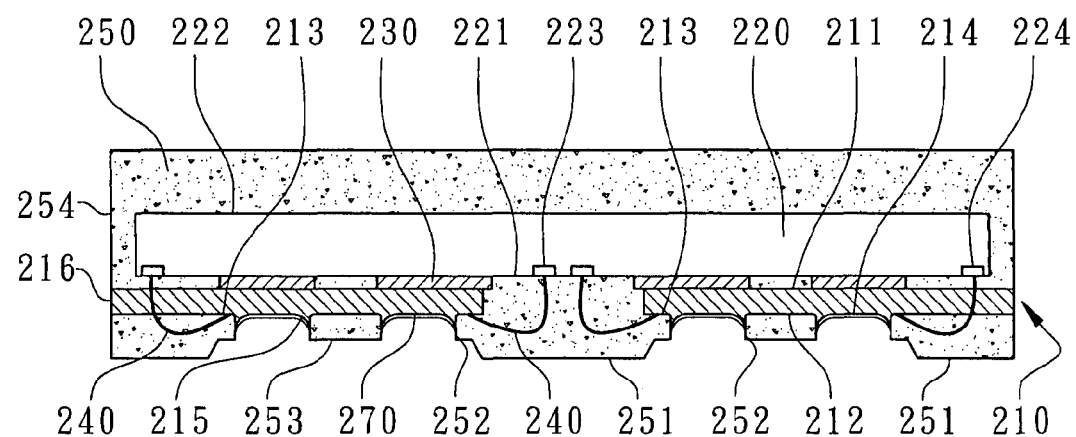

Then, step 7 of FIG. 5 is illustrated in FIG. 6G The plating layer 270 is formed on the ball-placement areas 214 and on the internal sides 215A of the lips 215 by electroplating.

Then, step 8 of FIG. 5 is illustrated in FIG. 2 and FIG. 4. The solder balls 260 are disposed on the ball-placement areas 214 and on the internal sides 215A of the lips 215 by ball placement technologies such as solder paste printing and reflow or solder ball alignment and reflow so that the solder balls 260 are partially embedded in the corresponding cavities 252.

Finally, in step 9 of FIG. 5, the leadframe and the encapsulant 250 are singulated to form a plurality of individual BGA packages 200 by sawing tools.

Figure 7:
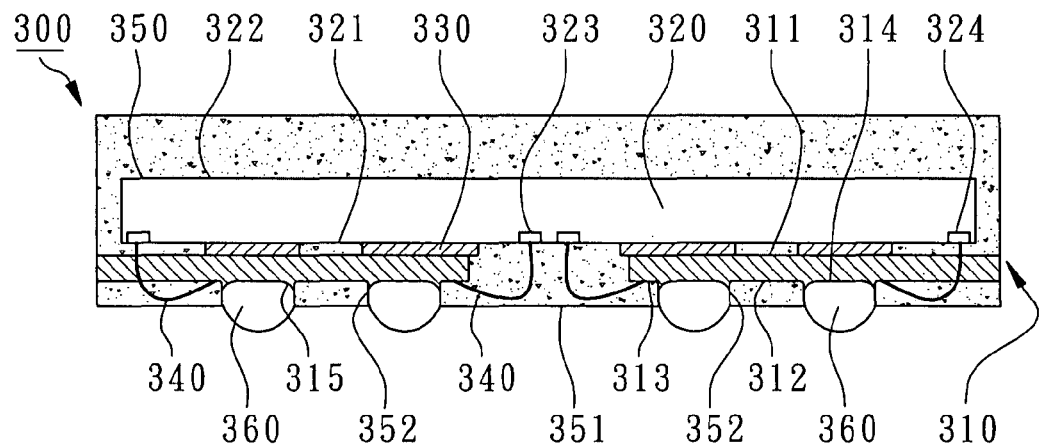
FIG. 7 shows a cross-sectional view of a BGA package with LOC configuration according to the second embodiment of the present invention.

In the second embodiment of the present invention, another BGA package is revealed. As shown in FIG. 7, the package 300 primarily comprises a leadless leadframe having a plurality of leads 310, a chip 320, a die-attaching layer 330, a plurality of bonding wires 340, an encapsulant 350, and a plurality of solder balls 360. The major components are about the same as the first embodiment. Each lead 310 has a top surface 311 and a bottom surface 312. The bottom surface 312 includes a wire-bonding area 313 and a ball-placement area 314. Each lead 310 further has a lip 315 projecting from the bottom surfaces 312 and enclosing the peripheries of the ball-placement areas 314. The chip 320 is attached to the top surfaces 311 of the leads 310 by the die-attaching layer 330. The chip 320 has an active surface 321 and a back surface 322 where a plurality of first bonding pads 323 and at least a second bonding pad 324 are formed at the center and at the peripheries of the active surface 321, respectively. The die-attaching layer 330 adheres to the active surface 321 of the chip 320 to the top surfaces 311 of the leads 310 to be LOC configurations. The first bonding pads 323 and the second bonding pad 324 of the chip 320 are electrically connected to the corresponding wire-bonding areas 313 of the leads 310 by the bonding wires 340. The encapsulant 350 encapsulates the chip 320, the bonding wires 340, the die-attaching layer 330, the top surfaces 311, and the laterals of the leads 310 between the top surfaces 311 and the bottom surfaces 312. The ball-placement areas 314 are embedded in the encapsulant 350. A plurality of cavities 352 are formed in the bottom surface 351 of the encapsulant 350 and are aligned with the corresponding ball-placement areas 314. Accordingly, the encapsulant 350 further encapsulates most of the bottom surfaces 312 except the ball-placement areas 314. Additionally, the lips 315 have a plurality of internal sides exposed inside the cavities 352. In the present embodiment, the bottom surface 351 of the encapsulant 350 can be flat and lower than the bottom surfaces 312 of the leads 310. Furthermore, the solder balls 360 are disposed on the ball-placement areas 314 and the internal sides of the lips 315 to make the solder balls 360 partially embedded inside the corresponding cavities 352. The solderability of the solder balls 360 and the reliability of wire-bonding and the stability of solder ball placement can be enhanced by using a leadless leadframe as a chip carrier.

Figure 8:
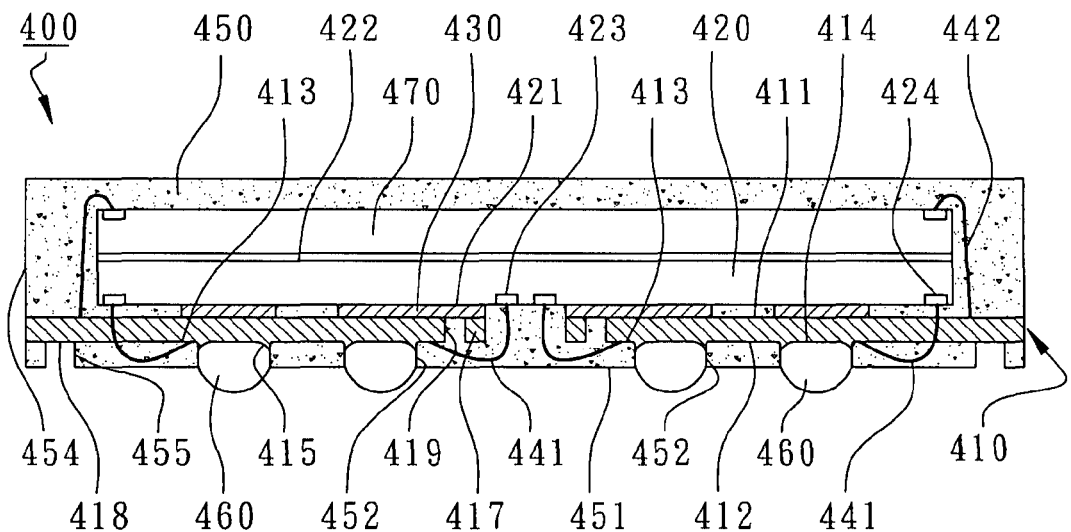
FIG. 8 shows a cross-sectional view of a BGA package with LOC configuration according to the third embodiment of the present invention.

Another BGA package 400 is revealed in the third embodiment of the present invention, as shown in FIG. 8, primarily comprising a leadless leadframe having a plurality of leads 410, a first chip 420, a die-attaching layer 430, a plurality of first bonding wires 441, an encapsulant 450, and a plurality of solder balls 460. Each lead 410 has a top surface 411 and a bottom surface 412 where the bottom surface 412 includes a wire-bonding area 413 and a ball-placement area 414. The leads 410 have a plurality of lips 415 projecting from the bottom surfaces 412 to enclose the peripheries of the ball-placement areas 414. In the present embodiment, the leadless leadframe further has a plurality of bus leads 417 where the bus leads 417 are disposed adjacent to a plurality of internal ends 419 of the leads 410 and approximately perpendicular to the leads 410. The first chip 420 is disposed on the top surfaces 411 of the leads 410 and has an active surface 421 where a plurality of first bonding pads 423 and a plurality of second bonding pads 424 disposed on the center and the peripheries of the active surface 421 respectively. The die-attaching layer 430 adheres the active surface 421 of the first chip 420 to the top surfaces 411 of the leads 410. To be more specific, the die-attaching layer 430 mechanically connects the bus leads 417 and the leads 410 to prevent shift of the bus leads 417. The first bonding wires 441 electrically connect the first bonding pads 423 and the second bonding pads 424 to the corresponding wire-bonding areas 413 of the leads 410. The encapsulant 450 encapsulates the first chip 420, the first bonding wires 441, the die-attaching layer 430, the top surfaces 411 of the leads 411, and the laterals of the leads 410 between the top surfaces 411 and the bottom surfaces 412. The encapsulant 450 further encapsulates the bottom surfaces 412 except the ball-placement areas 414 to make the ball-placement areas 414 embedded into the bottom 451 of the encapsulant 450. The encapsulant 450 has a plurality of cavities 452 in the bottom 451 aligned with the ball-placement areas 414. The lips 415 have a plurality of internal sides exposed inside the cavities 452. In this embodiment, the bottom 451 of the encapsulant 450 is planar. The solder balls 460 are disposed on the ball-placement areas 414 and the internal sides of the lips 415 to make the solder balls 460 partially embedded inside the corresponding cavities 452.

In the present embodiment, at least one of the bottom surfaces 412 of the leads 410 further includes a probing area 418 adjacent to the side 454 of the encapsulant 450. Additionally, the encapsulant 450 has at least a peripheral cavity 455 formed in the bottom 451 of the encapsulant 450 to expose the probing area 418. Accordingly, the probing area 418 embedded in the encapsulant 450 is configured for probe testing.

As shown in FIG. 8, in the present embodiment, the BGA package 400 further comprises a stacked second chip 470 disposed on the back surface 422 of the first chip 420 and encapsulated by the encapsulant 450. To be more specific, the second chip 470 and the first chip 420 are back-to-back stacked where the second chip 470 is electrically connected to the top surfaces 411 of the leads 410 by a plurality of second bonding wires 442.

Figure 9:
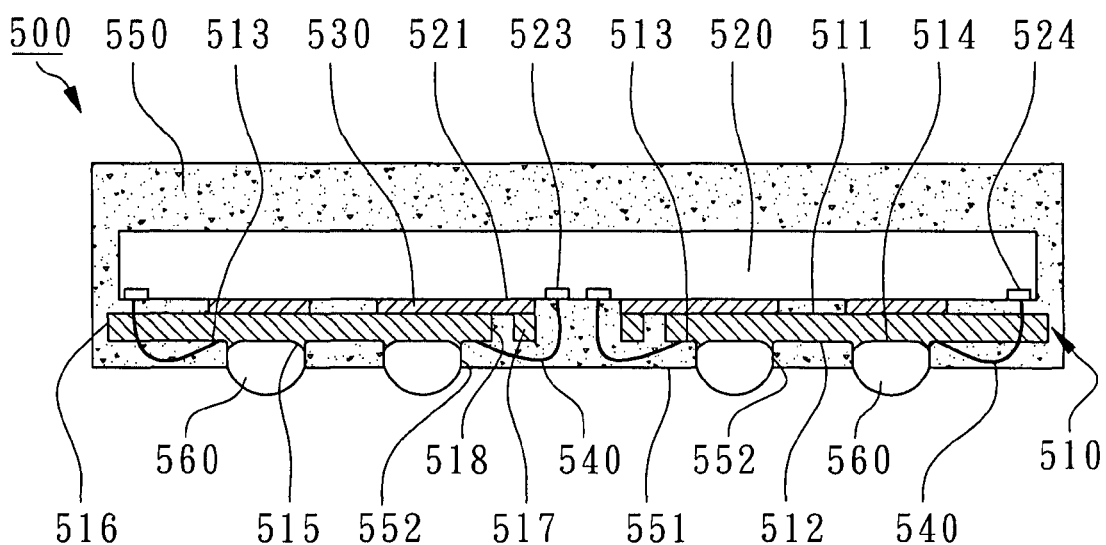
FIG. 9 shows a cross-sectional view of a BGA package with LOC configuration according to the fourth embodiment of the present invention.

As shown in FIG. 9, the fourth embodiment of the present invention, another BGA package 500 primarily comprises a leadless leadframe having a plurality of leads 510, a chip 520, a die-attaching layer 530, a plurality of bonding wires 540, an encapsulant 550, and a plurality of solder balls 560. Each lead 510 has a top surface 511 and a bottom surface 512 where the bottom surface 512 includes a wire-bonding area 513 and a ball-placement area 514. Each lead 510 further has a lip 515 projecting from the bottom surface 512 and surrounding the peripheries of the ball-placement area 514. In the present embodiment, the lip 515 is a circular ring in a closed form to offer a non-planar ball pad. Each lead 510 further has an external end 516 formed between the top surface 511 and the bottom surface 512 away from the chip 520 where the external end 516 is encapsulated by the encapsulant 550 so that all of the leads 510 are encapsulated by the encapsulant 550 except the ball-placement areas 514. The leadframe further has a plurality of bus leads 517 disposed adjacent to a plurality of internal ends 518 of the leads 510 and approximately perpendicular to the leads 510. The chip 520 is disposed on the top surfaces 511 of the leads 510 and has an active surface 521 with a plurality of first bonding pads 523 and a plurality of second bonding pads 524 disposed on the center and the peripheries of the active surface 521 respectively. The die-attaching layer 530 adheres to the active surface 521 of the chip 520 to the top surfaces 511 of the leads 510. The bonding wires 540 electrically connect the first bonding pads 523 and the second bonding pads 524 of the chip 520 to the corresponding wire-bonding areas 513 of the leads 510. The encapsulant 550 encapsulates the chip 520, the bonding wires 540, the die-attaching layer 530, the top surfaces 511 of the leads 510, and the laterals of the leads 510 between the top surfaces 511 and the bottom surfaces 512. The ball-placement areas 514 are embedded in the encapsulant 550. Moreover, a plurality of cavities 552 are formed in the bottom 551 of the encapsulant 550 and aligned with the ball-placement areas 514 so that the encapsulant 550 further encapsulates the bottom surfaces 512 of the leads 510 except the ball-placement areas 514. The lips 515 have a plurality of internal sides exposed inside the cavities 552. The solder balls 560 are disposed on the ball-placement areas 514 and the internal sides of the lips 515 to make the solder balls 560 partially embedded into the corresponding cavities 552. Therefore, the BGA package 500 according to the present invention provides non-planar ball-joint surfaces consisting of the ball-placement areas 514 and the internal sides of the lips 515 to increase the ball-joint areas and to reduce the voids at the peripheries of the ball-placement areas 514 so that the joint strengths of the solder balls 560 can be enhanced.

The above description of embodiments of this invention is intended to be illustrative and not limiting. Other embodiments of this invention will be obvious to those skilled in the art in view of the above disclosure.

What is claimed is:

1. A BGA package comprising:
    a leadframe having a plurality of leads, wherein each lead has a top surface and a bottom surface including a wire-bonding area and a ball-placement area, wherein each lead further has a lip projecting from the bottom surface around the ball-placement area;
    a first chip disposed on the top surfaces of the leads, the chip having an active surface and a plurality of first bonding pads on the active surface;
    a die-attaching layer adhering to the active surface of the chip and the top surfaces of the leads;
    a plurality of bonding wires connecting the first bonding pads of the first chip to the corresponding wire-bonding areas of the leads;
    an encapsulant encapsulating the first chip, the bonding wires, the die-attaching layer, and the top surfaces, and a plurality of laterals of the leads between the top surfaces and the bottom surfaces, wherein the ball-placement areas are embedded in the encapsulant, wherein a plurality of cavities are formed in a bottom of the encapsulant and aligned with the corresponding ball-placement areas so that the encapsulant further encapsulating the bottom surfaces of the leads except the ball-placement areas, wherein the lips have a plurality of internal sides exposed inside the cavities; and
    a plurality of solder balls disposed on the ball-placement areas and the internal sides of the lips to be partially embedded in the corresponding cavities.

2. The BGA package of claim 1, wherein the internal sides of the lips are connected with the corresponding cavities in a shape of a continuous arc.

3. The BGA package claim 1, wherein the roughness of the bottom surfaces of the leads is greater than the one of the top surfaces.

4. The BGA package of claim 3, further comprising a plating layer formed on the ball-placement areas of the leads and the internal sides of the lips.

5. The BGA package of claim 1, wherein each lead further has an external end formed between the top surface and the bottom surface away from the first chip.

6. The BGA package of claim 5, wherein the external ends are exposed from one side of the encapsulant.

7. The BGA package of claim 5, wherein the external ends are encapsulated by the encapsulant.

8. The BGA package of claim 5, wherein at least one of the bottom surfaces of the leads further includes a probing area adjacent to the side of the encapsulant, wherein the encapsulant has at least a peripheral cavity formed in the bottom of the encapsulant to expose the probing area.

9. The BGA package of claim 1, wherein the leadless leadframe further has at least a bus lead disposed adjacent to a plurality of internal ends of the leads and approximately perpendicular to the leads.

10. The BGA package of claim 9, wherein the die-attaching layer mechanically connects the bus leads and the leads.

11. The BGA package of claim 1, further comprising a second chip disposed on a back surface of the first chip and encapsulated by the encapsulant.

12. The BGA package of claim 1, wherein each lip has a sharp edge disposed at the interfaces between the encapsulant and the solder balls.

13. The BGA package of claim 1, wherein the first chip further has at least a second bonding pad formed on the active surface, wherein the first bonding pads are disposed at a central line of the active surface and the second bonding pads are disposed at one of peripheries of the active surface, wherein the second bonding pad is not covered by either the patterned die-attaching layer nor the leads.

14. The BGA package claim 1, wherein the die-attaching layer is patterned to overlap the wire-bonding areas and the ball-placement areas of the leads.

15. The BGA package of claim 14, wherein the die-attaching layer is a low modulus elastomer.

16. The BGA package of claim 1, wherein the active surface of the first chip is not smaller than 70% of the bottom of the encapsulant to be a Chip Scale Package.

17. The BGA package of claim 1, wherein the encapsulant further has at least a recession lower than the bottom of the encapsulant, and the cavities are disposed inside the recession.

18. The BGA package of claim 1, wherein joint interfaces between the solder balls and the leads are non-planar.

19. The BGA package of claim 18, wherein joint interfaces have a cross-section of meniscus.

20. The BGA package of claim 18, wherein the lips are circular rings in a closed form.

* * * * *